(12) United States Patent
Kamijima (10) Patent No.: US 6,663,761 B2
(45) Date of Patent: Dec. 16, 2003

(54) FINE PATTERN FORMING METHOD, DEVELOPING/WASHING DEVICE USED FOR THE SAME, PLATING METHOD USING THE SAME, AND MANUFACTURING METHOD OF THIN FILM MAGNETIC HEAD USING THE SAME

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 316 days.

(21) Appl. No.: 09/827,162

(22) Filed: Apr. 6, 2001

(65) Prior Publication Data

US 2001/0035343 A1 Nov. 1, 2001

(30) Foreign Application Priority Data

Apr. 28, 2000 (JP) ........................................ 2000-131367

(51) Int. Cl.[7] .................... C23C 14/34; C23C 16/00; G03C 1/73; C25D 5/02
(52) U.S. Cl. .................. 205/122; 205/118; 204/192.15; 430/312; 430/313; 430/135; 430/325; 438/780; 427/98; 427/123; 427/124
(58) Field of Search ............... 204/192.15; 430/312, 430/313, 315, 325; 438/780; 427/123, 124, 98; 205/118, 122

(56) References Cited

U.S. PATENT DOCUMENTS 3,853,715 A    12/1974  Romankiw ................... 205/122
5,538,820 A  *  7/1996  Fisher .......................... 430/18
5,858,620 A  *  1/1999  Ishibashi et al. ............. 430/313

FOREIGN PATENT DOCUMENTS

| JP | 56-36706 | B2 |   | 8/1981 |
| JP | 6-250379 | A  |   | 9/1994 |
| JP | 9-160259 |    | * | 6/1997 |
| JP | 10-73927 | A  |   | 3/1998 |
| JP | 11-204399| A  |   | 7/1999 |

OTHER PUBLICATIONS

Computer translation of 09–160259.*

* cited by examiner

*Primary Examiner*—Rodney G. McDonald
(74) *Attorney, Agent, or Firm*—Oliff & Berridge, PLC (57) ABSTRACT

The invention provides a fine pattern forming method in which a pattern interval of a resist pattern is narrowed, and a fine pattern forming material can be certainly formed on a surface of the resist pattern. In the method, a first resist layer containing a material generating acid by heating or light irradiation is coated on a substrate, is exposed through a pattern, and is developed. A developing solution is washed by a washing solution to form a first resist frame, and in a state where the washing solution is adhered to the substrate, a fine pattern forming material containing a material, which is cross-linked by the existence of acid, is coated on the substrate. Acid is generated in the first resist frame by heating or light irradiation, and the first resist frame is covered with a cross-linked layer generated on an interface between the first resist frame and the fine pattern forming material.

4 Claims, 11 Drawing Sheets

FINE PATTERN FORMING METHOD, DEVELOPING/WASHING DEVICE USED FOR THE SAME, PLATING METHOD USING THE SAME, AND MANUFACTURING METHOD OF THIN FILM MAGNETIC HEAD USING THE SAME

BACKGROUND OF THE INVENTION

1. Field of the Invention

The present invention relates to a method of forming a fine pattern in which a pattern interval of a resist pattern or a hole diameter is narrowed, and a developing/washing device used for the same, and further, to a plating method (hereinafter referred to as a frame plating method) for forming a plating film by using a mold formed by patterning a resist, and a manufacturing method of a thin film magnetic head provided with an induction type magnetic head as a recording head.

2. Description of the Related Art

A composite type thin film magnetic head including a magnetoresistive (MR) head used for data reproduction and an induction type magnetic head used for data recording is used as a magnetic head of a magnetic disk device.

The MR head includes any one of an AMR (Anisotropic Magnetoresistive) component using an AMR effect, a GMR (Giant Magnetoresistive) component using a GMR effect, and a TMR (Tunneling Magnetoresistive) component using a tunnel junction film indicating a magnetoresistive effect. As the surface recording density of a magnetic recording medium becomes high, a component to be used is changed from the AMR component to the GMR component, and further, to the TMR component.

As one factor for determining the performance of the MR heads, there is optimization of MR height. The MR height is a height of the MR component from an end portion at a side of an air bearing surface (ABS) opposite to a magnetic recording surface of a magnetic recording medium to an end portion at the opposite side, and this height depends on an amount of polishing of the ABS surface in a head manufacturing process.

The induction type magnetic head realizes a ring structure having a narrow gap by a semiconductor process, and includes upper and lower magnetic poles which are laminated through an insulating film and has a gap (write gap) at the side of the ABS surface to form a closed magnetic path, and a thin film coil formed in the insulating film between the upper and lower magnetic poles. A head material is magnetized to high magnetic flux density by a recording current flowing through the thin film coil, and predetermined leakage magnetic field is formed over the gap to record data on the magnetic recording medium.

As one factor for determining the performance of the induction type magnetic head, there is optimization of throat height (TH). The throat height is a height of the magnetic pole from the ABS surface to the end portion of the insulating film, and this height also depends on an amount of polishing of the ABS surface in the head manufacturing process. In order to improve the head efficiency of the recording head, it is necessary to make the throat height as small as possible.

In order to raise the recording density, it is necessary to raise the track density of the magnetic recording medium. For that purpose, it is necessary to realize a recording head in which a magnetic pole width and a gap width at the ABS surface are made narrow, and a semiconductor processing technique is used for realizing this.

The foregoing composite type thin film magnetic head is manufactured through a plurality of manufacturing processes, for example, a sputtering process, a photolithography process, a frame plating process, an etching process, a polishing process, and the like. Herein after,an example of a manufacturing method of the thin film magnetic head will be described in brief.

First, an $Al_2O_3TiC$ substrate having high hardness and excellent in wear resistance is used. When the magnetic head is completed, this substrate itself functions as a slider body of the magnetic head. The reason why the substrate having high hardness and excellent in wear resistance is used is to secure floating accuracy of the head and to obtain accurate MR height and throat height.

A film having high adhesiveness, for example, a chromium film is formed on the $Al_2O_3TiC$ substrate by sputtering or the like. Next, a lower shield layer made of, for example, Permalloy is formed. Next, an MR component interposed between insulating films is formed on the lower shield layer.

Next, an upper shield layer made of Permalloy or the like is formed. By this, an MR head for reproduction is completed. The upper shield layer is also used as a lower magnetic pole of an induction type magnetic head for recording.

Next, an insulating film for formation of a gap is formed on the lower magnetic pole, and further, an insulating film is formed, and then, a film excellent in adhesiveness to an oxide, for example, a chromium film is formed thereon by sputtering or the like. Next, there is formed a thin film of, for example, copper, which becomes an electrode film when a frame plating method is used. Next, a copper coil of a first layer is formed by the frame plating method. As the need arises, coils of second to third layers are also formed in the same way.

After the formed thin film coil is embedded by an insulating film, an upper magnetic pole made of, for example, permalloy is formed thereon by using the frame plating method. A recording gap layer is formed by carrying out etching, while the upper magnetic pole at the side of the ABS surface is used as a mask. The upper magnetic pole is formed so that it is connected to the lower magnetic pole through the coil at the opposite side of the recording gap layer so as to constitute a closed magnetic path. A protective film is formed on an upper layer of the upper magnetic pole, and the film forming process is completed.

Next, the $Al_2O_3TiC$ substrate is cut into rod-like substrates including several tens heads. The ABS formation surface of the rod-like substrate is polished to provide the throat height of a height of several $\mu$m. After the ABS surface is formed, the rod-like substrate is cut, so that a plurality of thin film magnetic heads are completed. In the manufacturing method of the thin film magnetic head as described above, the frame plating method is used for the formation of the thin film coil or the formation of the upper magnetic pole.

A conventional frame plating method will be described in brief with reference to FIGS. 9A to 9E. The frame plating method is a method of patterning a plating film by using a mold formed by patterning a resist, as disclosed in, for example, Japanese Patent Publication No. S56-36706.

Figure 9A:
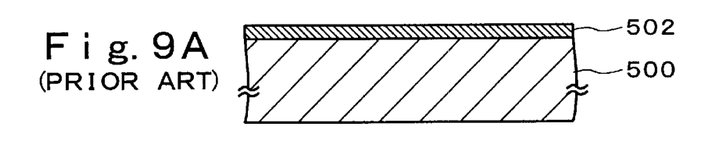
FIGS. 9A to 9E are sectional views showing a manufacturing process of a plating film using a conventional frame plating method.

FIGS. 9A to 9E are sectional views showing a manufacturing process of a plating film using the conventional frame plating method. As shown in FIG. 9A, an electrode film 502 is formed on an insulating substrate 500 by using a sputtering method or an evaporation method. At a lower layer of the electrode film 502, an adhesive layer, for example, a Cr (chromium) film or a Ti (titanium) film, may be formed to raise the adhesiveness to the insulating substrate 500. Although there is no problem when the electrode film 502 is made of a material having conductivity, if possible, it is desirable to use the same material as a metal material to be plated.

Figure 9B:
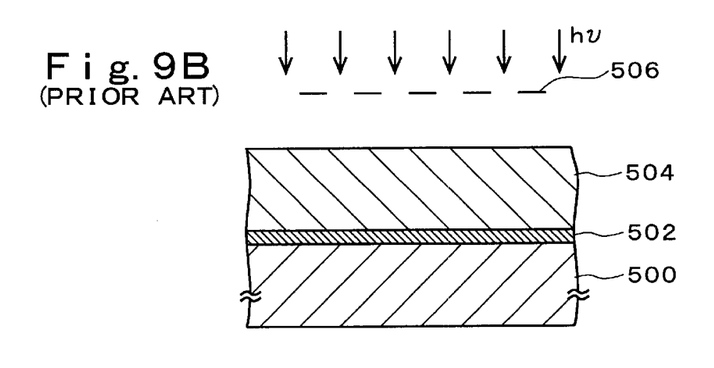
Figure 9C:
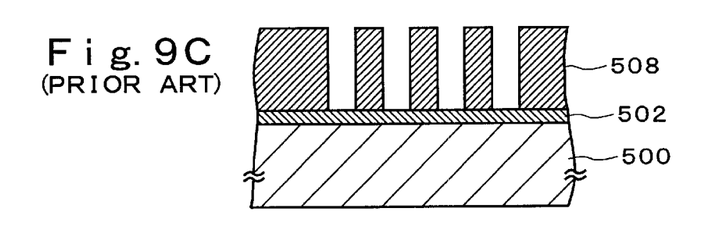

Next, as shown in FIG. 9B, a resist is coated on the whole surface to form a resist layer 504, and as the need arises, a prebake treatment of the resist layer 504 is performed. Next, exposure light is irradiated through a mask 506 on which a predetermined pattern is drawn, so that the resist layer 504 is exposed.

Next, as the need arises, a heat treatment is performed, and then, development is carried out by an alkaline developing solution. As the alkaline developing solution, for example, tetramethylammonium hydroxide (TMAH) of a concentration of 2.38 wt % is used. Next, the developing solution in the resist layer 504 is washed by a washing solution, and a development dissolving reaction in the resist layer 504 is stopped, so that resist frames 508 patterned into a predetermined shape are formed (see FIG. 9C).

Figure 9D:
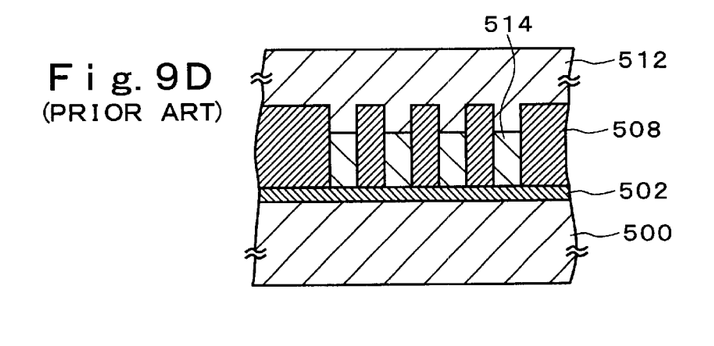
Figure 9E:
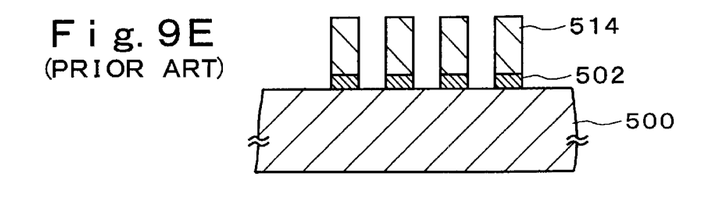

Next, the substrate 500 is immersed in a plating solution 512 in a plating bath, and a plating process is carried out using the resist frames 508 as a mold, so that plating films 514 are formed between the resist frames 508 (see FIG. 9D).

Next, as the need arises, water washing and drying are carried out, and then, the resist frames 508 are peeled off from the substrate 500 by using an organic solvent. Next, the electrode film 502 is removed by dry etching (ion milling, reactive ion etching (RIE), etc.) or wet etching while the plating films 514 are used as a mask (see FIG. 9E). The above is an outline of the frame plating method. Like this, the frame plating method is a technique for forming the plating films 514 of a predetermined shape using the resist frames 508 obtained by patterning the resist layer 504 as a mold.

In recent years, as the surface recording density becomes high, a track width of a thin film magnetic head increasingly becomes narrow, and as a result, it becomes necessary to form an upper magnetic pole so that a very narrow magnetic pole width can be obtained. To this end, it is necessary to narrow a trench width between resist frames when an upper magnetic pole is formed by the frame plating method.

As means for realizing narrowing of an interval between the resist frames, there is a fine pattern forming method disclosed in, for example, Japanese Patent Unexamined Publication No. H06-250379, Japanese Patent Unexamined Publication No. H10-73927, or Japanese Patent Unexamined Publication No. H11-204399. In this fine pattern forming method, the surface of a resist pattern containing a material generating acid by heating or light irradiation is covered with a resist (fine pattern forming material) containing a material which is cross-linked by the existence of acid. Acid is generated in the resist pattern by heating (mixing bake) or light irradiation, and a cross-linked layer generated on an interface is formed as a covering layer of the resist pattern, so that the width of the resist pattern is thickened. By this, the interval between the resist patterns can be narrowed.

Figure 10A:
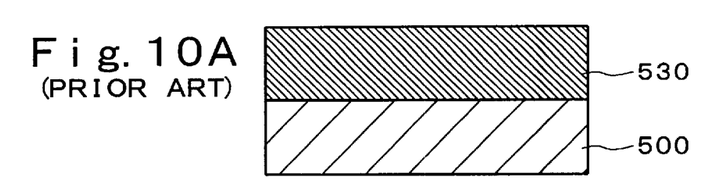
FIGS. 10A to 10E are sectional views showing a manufacturing process of a conventional fine pattern forming method.

This fine pattern forming method will be described in brief with reference to FIGS. 10A to 10E. First, as shown in FIG. 10A, after a first resist layer 530 which includes a mechanism for generating acid in the inside by a suitable heat treatment, is coated on a substrate 500 by spin coating or the like, prebaking is carried out as the need arises. Next, in order to form a first resist pattern, the first resist layer 530 is exposed through a mask on which a predetermined pattern is drawn.

Figure 10B:
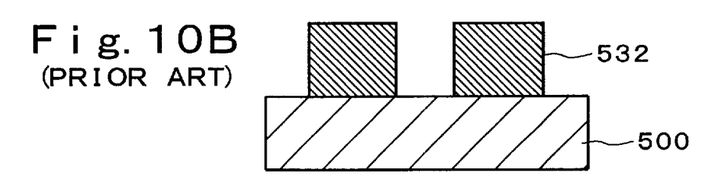

After the first resist layer 530 is exposed, postbaking is carried out as the need arises, and an alkaline solution such as TMAH is used as a developing solution to carry out development. Next, the developing process successively shifts to a washing process. The developing solution in the resist layer 530 is washed by a washing solution, and a development dissolving reaction in the resist layer 530 is stopped, so that as shown in FIG. 10B, a first resist pattern 532 patterned into a predetermined shape is formed. Incidentally, as the washing solution, for example, pure water is used. When the washing is ended, the washing solution is blown away and the substrate 500 is dried.

Figure 10C:
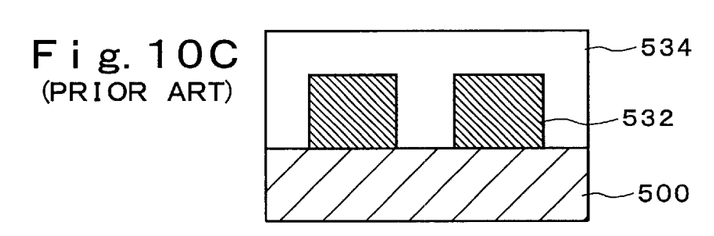

Next, as shown in FIG. 10C, a soluble second resist layer 534 containing a cross-linking material, which is cross-linked by the existence of acid, as its main ingredient and being dissolved in a solution, which does not dissolve the first resist pattern 532, is coated on the substrate 500. Next, after the second resist layer 534 is coated, prebaking is carried out as the need arises.

Figure 10D:
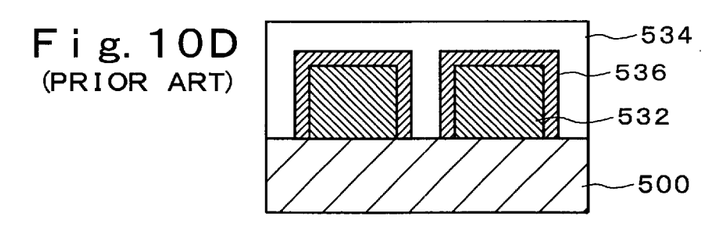

Next, as shown in FIG. 10D, the first resist pattern 532 formed on the substrate 500 and the second resist layer 534 formed thereon are subjected to mixing baking to accelerate diffusion of acid from the first resist pattern 532, and the acid is supplied into the second resist layer 534, so that a cross-linking reaction is generated at the interface between the second resist layer 534 and the first resist pattern 532. A cross-linked layer in which the cross-linking reaction has been generated by this mixing baking is formed in the second resist layer 534 so as to cover the first resist pattern 532.

Figure 10E:
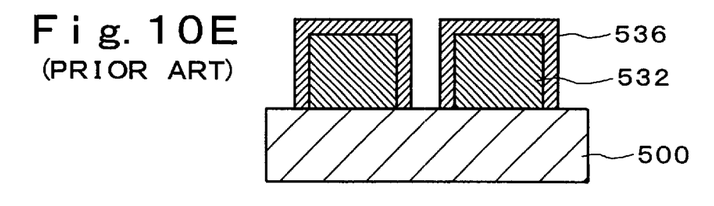

Next, after the second resist layer 534 which has not been cross-linked is removed by using a developing solution, washing is carried out. A washing solution, for example, pure water is sprayed onto the surface of the substrate 500 to carry out the washing, and as shown in FIG. 10E, a second resist pattern 536 in which the first resist pattern 532 is covered with the cross-linked layer is formed.

The second resist pattern 536 formed through the above processes becomes a resist pattern in which a hole inner diameter of a hole pattern and a separation width of a line pattern are narrower than the first resist pattern 532.

When the resist frame which is formed by the foregoing fine pattern forming method and in which the interval is narrowed, is applied to a frame plating method in a manufacturing method of a thin film magnetic head, there occurs a possibility that an upper magnetic pole having a fine width can be formed.

However, when the upper magnetic pole of the thin film magnetic head is formed by the frame plating method, since undulations having a relatively large difference in height are produced in a coating region of the resist layer, a locally very thick resist layer is formed. Since a pattern of a relatively very thin line width is formed to this thick resist layer, a resist frame having a high aspect ratio is formed. Besides, there also occurs a state where a frame film thickness is extremely thick with respect to a width of a trench between the resist frames.

Even if a fine pattern forming material is coated on the resist frame in this state, the fine pattern forming material does not permeate to the bottom of the trench, and there occurs a disadvantage that a covering layer is not uniformly formed on the side wall of the resist frame. This disadvantage remarkably occurs at the side wall of the resist frame especially at the bottom of the trench, and it becomes remarkable as the aspect ratio (ratio of a thickness of a resist layer to a trench width) of the trench pattern becomes high.

Further, if the aspect ratio of the trench pattern is high, even if a prewet treatment in which a hydrophilic treatment, such as water treatment or surface active agent treatment, is performed on the surface of the resist frame, is carried out before the fine pattern forming material is coated on the resist frame, this disadvantage is not improved.

SUMMARY OF THE INVENTION

An object of the present invention is to provide a fine pattern forming method in which a fine pattern forming material can be certainly formed on the surface of a resist pattern even if a film thickness of the resist pattern is very large as compared with a width between the resist patterns.

Another object of the present invention is to provide a developing/washing device suitably used for a fine pattern forming method in which a fine pattern forming material can be certainly formed on the surface of a resist pattern even if a film thickness of the resist pattern is very large as compared with a width between the resist patterns.

Still another object of the present invention is to provide a frame plating method using a fine pattern forming method in which a fine pattern forming material can be certainly formed on the surface of a resist pattern even if a film thickness of the resist pattern is very large as compared with a width between the resist patterns.

Still another object of the present invention is to provide a manufacturing method of a thin film magnetic head using a frame plating method using a fine pattern forming method in which a fine pattern forming material can be certainly formed on the surface of a resist pattern even if a film thickness of the resist pattern is very large as compared with a width between the resist patterns.

The above object is achieved by a fine pattern forming method characterized by coating a resist, which contains a material generating acid by heating or light irradiation, on a substrate, exposing the resist through a pattern and developing the resist, washing a developing solution out with a washing solution to form a resist pattern, coating a fine pattern forming material containing a material, which is cross-linked by existence of acid, on the substrate in a state where the washing solution is adhered to the substrate, generating acid in the resist pattern by heating or light irradiation, covering the resist pattern with a cross-linked layer generated on an interface between the resist pattern and the fine pattern forming material, developing a not-cross-linked layer of the fine pattern forming material by a developing solution for the fine pattern forming material, and washing the developing solution out with a washing solution.

The above fine pattern forming method of the present invention is characterized in that the substrate is not dried in a period from development of the resist pattern to coating of the fine pattern forming material.

Besides, the above object is achieved by a developing/washing device characterized by comprising a developing solution nozzle for spraying a developing solution for development of an exposed resist layer formed on a substrate, a washing solution nozzle for spraying a washing solution for washing the developing solution out, a fine pattern forming material spray nozzle for spraying a fine pattern forming material onto a surface of the substrate in a state where the washing solution is held without being dried after washing, and a fine pattern forming material developing solution spray nozzle for spraying a developing solution for the fine pattern forming material.

Further, the above object is achieved by a plating method characterized by forming an electrode film on a substrate, coating a resist, which contains a material generating acid by heating or light irradiation, on the substrate, forming resist pattern by exposing the resist through a pattern and developing the resist, washing a developing solution out with a washing solution, coating a fine pattern forming material containing a material, which is cross-linked by existence of acid, on the substrate in a state where the washing solution is adhered to the substrate, generating acid in the resist patterns by heating or light irradiation, covering the resist pattern with cross-linked layer generated on interface between the fine pattern forming material and the resist pattern, developing a not-cross-linked layer of the fine pattern forming material by a developing solution for the fine pattern forming material, washing the developing solution out with a washing solution, immersing a surface of the substrate in a plating solution, and forming a plating film between the covered resist patterns.

Furthermore, the above object is achieved by a manufacturing method of a thin film magnetic head, which comprises a plating process for forming a plating film by using a mold formed by patterning a resist and is characterized in that the plating process includes the plating method of the present invention.

DETAILED DESCRIPTION OF THE PREFERRED EMBODIMENTS

Figure 1A:
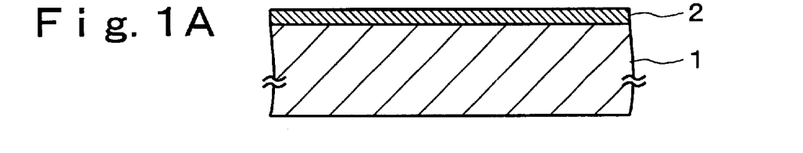
FIGS. 1A to 1D are process sectional views showing a fine pattern forming method and a frame plating method using the same according to a first embodiment of the present invention.

A case where a fine pattern forming method according to a first embodiment of the present invention is applied to a frame plating method will be described with reference to FIGS. 1A to 3C. FIGS. 1A to 1D and FIGS. 2A to 2E are sectional views showing a manufacturing process of a plating film using the frame plating method. First, as shown in FIG. 1A, an electrode film 2 is formed on an insulating substrate 1 by using a sputtering method or an evaporation method. An adhesive layer for improving adhesiveness to the insulating substrate 1 may be formed under the electrode film 2 by, for example, a Cr (chromium) film or a Ti (titanium) film. Although there is no problem as long as the conductive film 2 is made of a material having conductivity, if possible, it is desirable to use the same material as a metal material to be plated.

Figure 1B:
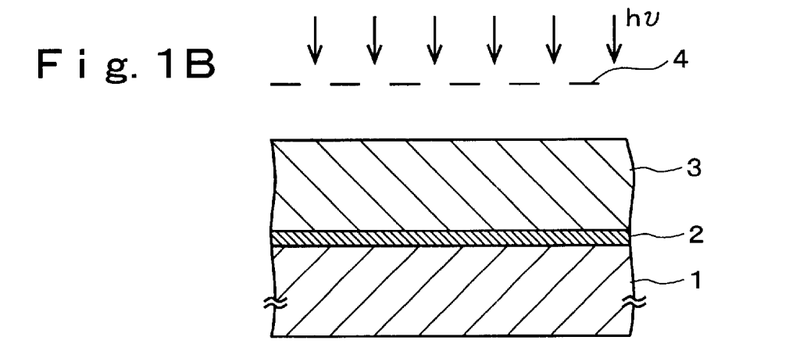

Next, as shown in FIG. 1B, a first resist including a mechanism for generating acid inside by a suitable heating treatment is coated on the whole surface by spin coating or the like to form a first resist layer 3, and a prebake treatment to the first resist layer 3 is carried out as the need arises. Next, exposure light is irradiated through a mask 4 on which a predetermined pattern is drawn, so that the resist layer 3 is exposed. As the first resist material, there is used a general resist material, integrated positive resist material, hydrophobic integrated positive resist material, or chemical amplification positive resist material, which has a structure for generating acid by heating.

As the general resist material, a mixture of alkaline soluble phenol resin and photosensitizer, for example, naphtoquinone diazide, is used. Specifically, there is used, for example, AZP4000 series, AZ9200 series, or AZEXP. 1131 series of Clariant Japan Co., FMRS series of Fiji Film Ohrin Co., TGMR series of Tokyo Ohka Co., or the like As the integrated positive resist material, a resist composition in which a photosensitive group is directly bonded to novolac resin is used. Specifically, there is used a resist composite containing, as alkaline soluble resin and photosensitizer, novolac resin obtained by replacing hydrogen atoms of hydroxyl groups of novolac resin having one or not less than two repetition units each expressed by constitution formula (1) shown in FIG. 11 and having weight average molecular weight of 1000 to 10000 equivalent in polystyrene by 1,2-naphtoquinone diazide sulphonyl group of 0.03 to 0.27 mole per hydrogen atom.

Figure 11:
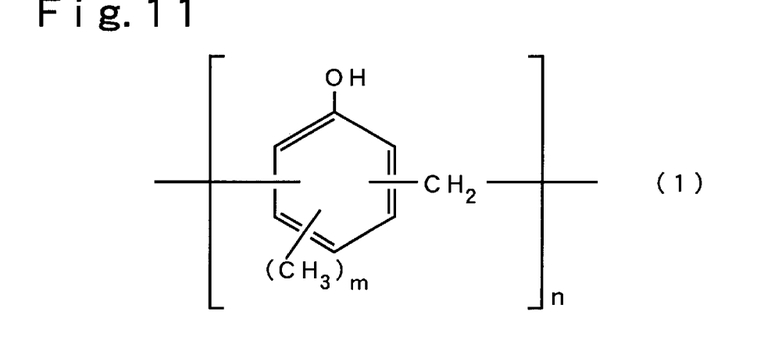
FIG. 11 is a view showing an example of a chemical constitution formula of a resist material used in the embodiments of the present invention.

In the formula (1) shown in FIG. 11, n is an integer of 1 to 4 and m is an integer of 0 to 3.

Figure 12A:
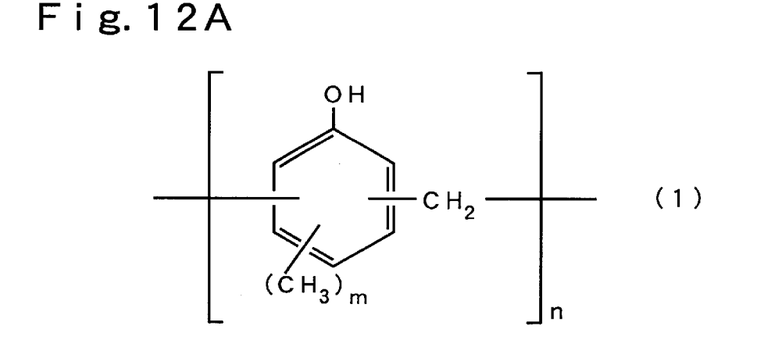
FIGS. 12A to 12D are views showing examples of chemical constitution formulae of resist materials used in the embodiments of the present invention.
Figure 12B:
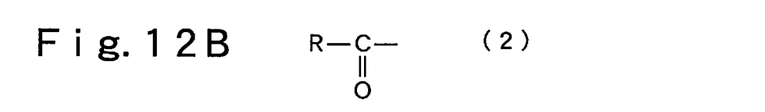
Figure 12C:
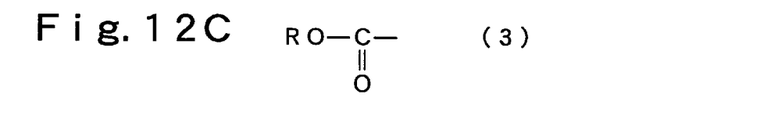
Figure 12D:
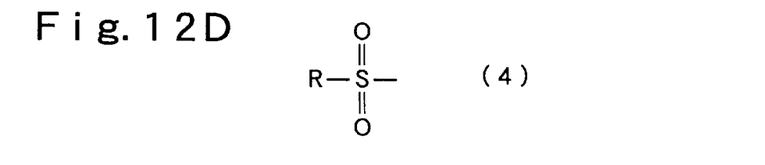

As the hydrophobic integrated positive resist material, a hydrophobic resist composite in which a photosensitive group is directly bonded to novolac resin is used. Specifically, there is used a resist composite containing (A): high molecular compound obtained by replacing part of hydrogen atoms of hydroxyl groups of novolac resin having a repetition unit expressed by constitution formula (1) shown in FIG. 12A and having weight average molecular weight of 1000 to 30000 equivalent in polystyrene by 1,2-naphtoquinone diazide sulphonyl group, and by replacing part of the remaining hydrogen atoms of the hydroxyl groups by one kind or not less than two kinds of substituents among functional groups shown by general formulae (2), (3) and (4) of FIGS. 12B to 12D, where, in the formula (1) of FIG. 12A, n is an integer of 1 to 4, m is an integer of 0 to 3, and in the formulae (2), (3) and (4) of FIGS. 12B to 12D, R is a linear chain, branch or cyclic alkyl group of carbon number 1 to 30, aryl group of carbon number 6 to 20, or aralkyl group of carbon number 7 to 20, or (B): a high molecular compound of (A) in which hydrogen atoms of hydroxyl groups of novolac resin are replaced by 1,2-naphtoquinone diazide sulphonyl groups at a ratio of 0.03 to 0.3 mole per hydrogen atom, and part of the remaining hydrogen atoms of the hydroxyl groups are replaced by one kind or not less than two kinds of substituents among the functional groups shown by the general formulae (2), (3) and (4) of FIGS. 12B to 12D at a ratio of 0.01 to 0.8 mole per hydrogen atom.

As the chemical amplification positive resist material, a mixture of resin containing a main ingredient having a acid catalytic reactive functional group and oxygen generating agent, or a mixture of resin, resin having an acid reactive functional group, and an acid generating agent is used. Specifically, AZ DX series of Clariant Japan Co., KRF series of Japan Synthetic Rubber (JSR) Co., SEPR series of Shin-Etsu Chemical Co., FKR series of Fiji Film Ohrin Co., TDUR series of Tokyo Ohka Co., APEX-E series of Shiplay Co., or the like is used.

Figure 1C:
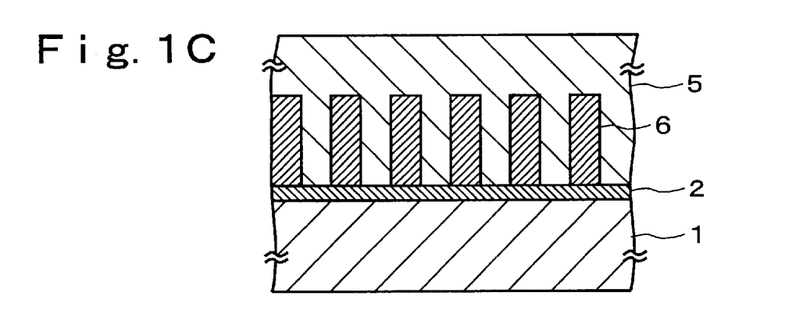

Next, after a heat treatment is carried out as the need arises, as shown in FIG. 1C, the exposed resist layer 3 is developed by an alkaline developing solution 5 to form first resist frames 6. As the alkaline developing solution 5, for example, tetramethylammonium hydroxide (TMAH) of a concentration of 2.38 wt % can be used.

Figure 1D:
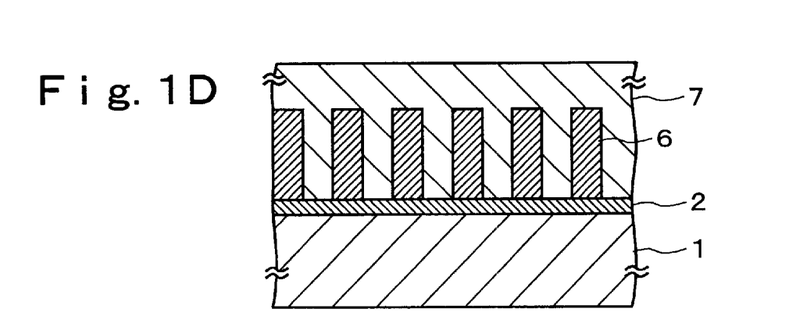

Next, the developing process successively shifts to a washing process. The developing solution 5 on the surfaces of the first resist frames 6 is washed by a washing solution 7, and a development dissolving reaction on the surfaces of the first resist frames 6 is stopped, so that as shown in FIG. 1D, the first resist frames 6 patterned into a predetermined shape are formed. As the washing solution 7, for example, pure water is used.

Figure 2A:
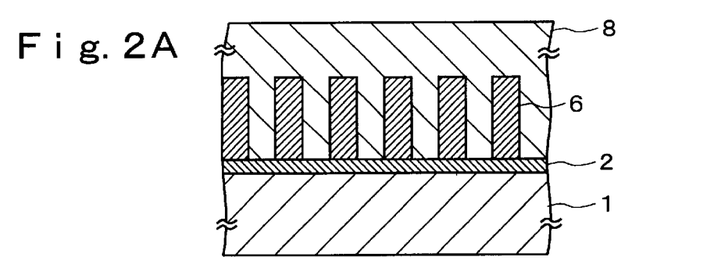
FIGS. 2A to 2E are process sectional views showing the fine pattern forming method and the frame plating method using the same according to the first embodiment of the present invention.

After washing is ended, as shown in FIG. 2A, in a state where the washing solution 7 is not blown away but a layer of the washing solution 7 is adhered (held) to the surface of the substrate 1, a soluble fine pattern forming material which contains, its main ingredient, a cross-linking material cross-linked by the existence of acid and is dissolved in a solution not dissolving the first resist frames 6, is coated on the whole surface to form a second resist layer 8. As the soluble fine pattern forming material, a mixture of a soluble cross-linking agent and a soluble resin can be used, and a surface active agent is added to them as the need arises.

As the soluble cross-linking agent, for example, an urea cross-linking agent, such as urea, alkoxymethylene urea, N-alkoxymethylene urea, ethylene urea, or ethylene urea carboxylic acid, amelamine cross-linking agent such as melamine, alkoxymethylene melamine, an amino cross-linking agent such as benzoguanamine or glycol uryl, or another cross-linking agent generating a cross-linking reaction by acid is used.

As the soluble resin, for example, polyacrylic acid, polyvinyl acetal, polyvinyl pirrolidone, polyvinyl alcohol, polyethylene imine, polyethylene oxide, stylene-maleic acid copolymer, polyvinylamine resin, polyallylamine, oxazoline group containing soluble resin, soluble melamine resin, soluble urea resin, alkyd resin, sulfonamide resin, or other resins are used.

As the surface active agent, a soluble surface active agent, for example, Frolard of Three M Co., or Nonipole of Sanyo kasei Co., is used.

As the soluble fine pattern forming material, specifically, for example, AZ R 200 of Clariant Japan Co., or the like is used.

Next, after the second resist layer 8 is coated, as the need arises, prebaking (for example, 85° C./70 sec) is carried out.

Like this, this embodiment has a feature that the substrate 1 is not dried during the period from the development of the first resist frame to the coating of the fine pattern forming material. By doing so, adherence of the fine pattern forming material to the side wall of the resist pattern, which has not been conventionally improved even by carrying out a prewet treatment, can be greatly improved.

Incidentally, the second resist layer 8 is soluble, is easily and quickly mixed with the washing solution 7 held on the substrate 1, and is diffused. Accordingly, although the concentration of the second resist layer 8 on the substrate 1 becomes uniform irrespective of places, in order to obtain uniformity more quickly, the substrate 1 may be naturally rotated or swung.

Figure 2B:
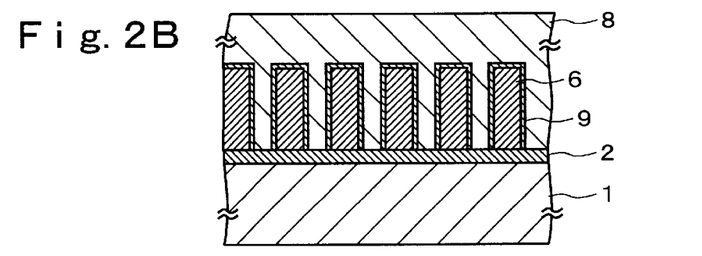

Next, as shown in FIG. 2B, the first resist frames 6 formed on the substrate 1 and the second resist layer 8 formed thereon are subjected to mixing bake (for example, 110° C./70 sec) to accelerate diffusion of acid from the first resist frames 6, and the acid is supplied into the second resist layer 8, so that a cross-linking reaction is generated at the interfaces between the second resist layer 8 and the first resist frames 6. Cross-linked layers 9 in which the cross-linking reaction is generated by this mixing bake are formed in the second resist layer 8 so as to cover the first resist frames 6.

Figure 2C:
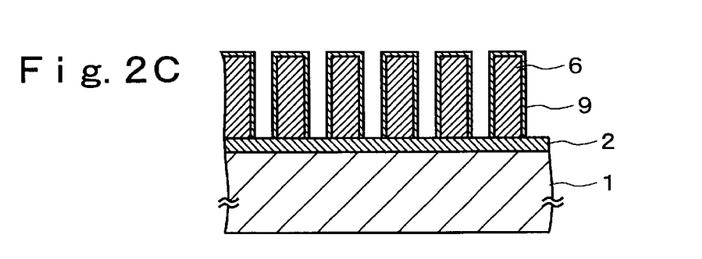

Next, after the second resist layer 8 which has not been cross-linked is removed by using a developing solution, washing is carried out. As the developing solution, pure water or, to such a degree that the resist pattern is not dissolved, a mixture solution of pure water and alcohol, for example, methanol, ethanol, propanol or buthanol, or a soluble organic solvent, such as N-methylpyrrolidone, 2-heptanone, or aceton, is used. Specifically, for example, AZ R2 or the like of Clariant Japan Co. is used. Thereafter, a washing solution, for example, pure water is sprayed onto the surface of the substrate 1 to carry out washing, and the second resist frames 9 patterned into a predetermined shape as shown in FIG. 2C are formed. The second resist frames 9 formed through the above process become resist patterns in which a separation width in the patterns is narrower than that in the first resist frames 6.

Figure 2D:
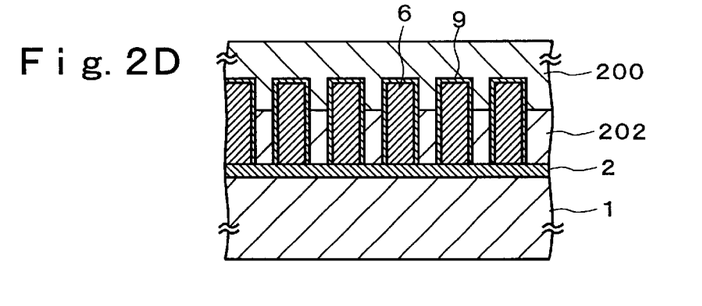

Next, as shown in FIG. 2D, the substrate 1 is immersed in a plating solution 200 in a plating bath, and a plating treatment is carried out while the second resist frames 9 are used as a mold, so that plating films 202 are formed between the second resist frames 9.

Figure 2E:
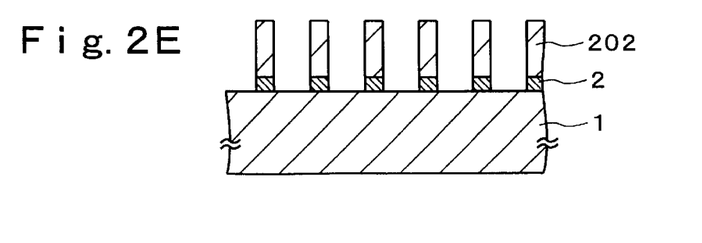

Next, in FIG. 2E, as the need arises, water washing and drying are carried out, and next, the second resist frames 9 and the first resist frames 6 are peeled off from the substrate 1 by using an organic solvent. Next, the electrode film 2 is removed by dry etching (ion milling, reactive ion etching (RIE), etc.) or wet etching using the plating films 202 as a mask. Here, the frame plating method of this embodiment is completed.

Like this, according to the fine pattern forming method and the frame plating method of this embodiment, in the washing process when the first resist frames 6 are formed, a treatment of blowing away and drying the washing solution 7 is not carried out. That is, while a water layer is held on the surface of the substrate 1 on which the first resist frames 6 are formed, the second resist layer 8 is coated.

By doing so, even in the resist frame having a high aspect ratio or even when a state occurs in which a frame film thickness is extremely larger than the width of a trench between the resist frames, it is possible to coat the fine pattern forming material on the resist pattern in this state and to make the fine pattern forming material permeate to the bottom of the resist pattern. Accordingly, there does not occur such a disadvantage that a covering layer is not formed only at the bottom of the resist pattern.

Figure 3A:
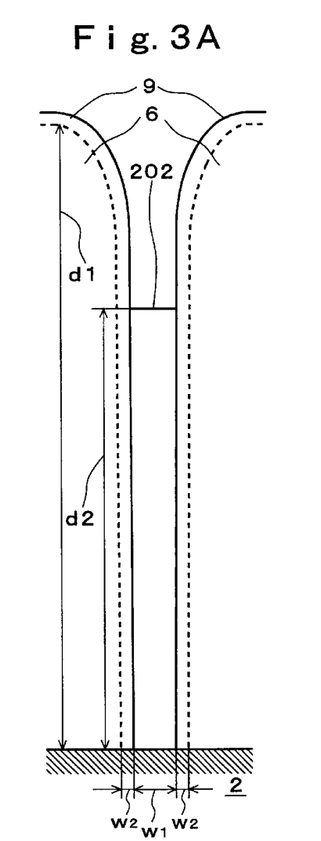
FIGS. 3A to 3C are views showing resist frames and sectional shapes of plating patterns plated by using the same, and comparison between the fine pattern forming method according to the first embodiment of the present invention and a forming method based on prior art.
Figure 3B:
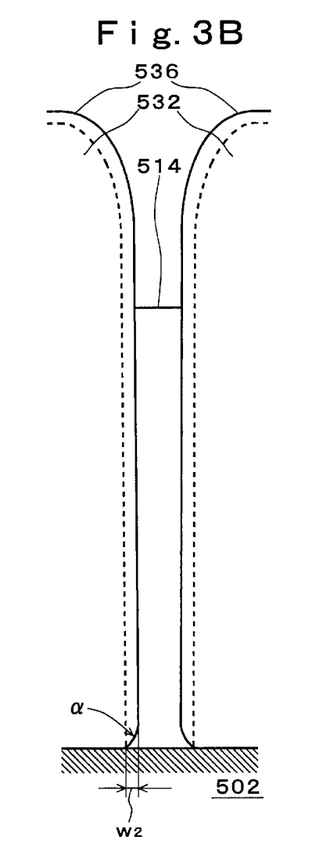
Figure 3C:
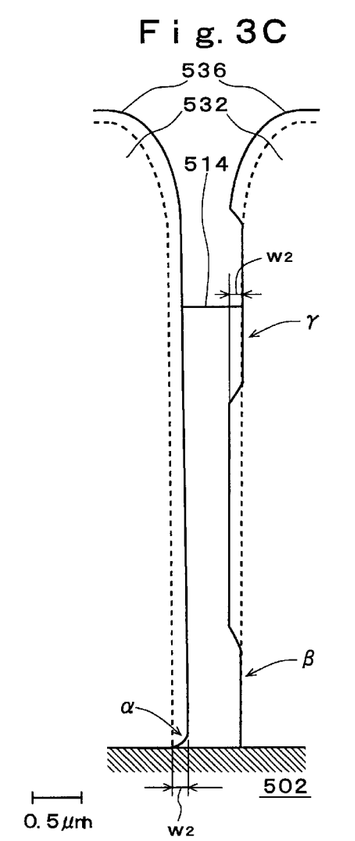

Next, a more specific example of this embodiment, together with a comparative example, will be described with reference to FIGS. 3A to 3C. FIG. 3A shows a section of a trench pattern formed between resist frames according to this embodiment. FIGS. 3B and 3C are sections showing comparative examples respectively based on the prior art.

Second resist frames 9 of this embodiment shown in FIG. 3A are formed by using the fine pattern forming method shown in FIGS. 1A to 1D and FIGS. 2A to 2E.

First, first resist frames 6 are formed to have a thickness (depth) $d=6.0$ $\mu$m and an interval $(w1+2\cdot w2)=0.6$ $\mu$m. Next, using the method of this embodiment, while a washing solution on a substrate is not dried but a water layer is held, a fine pattern forming material is coated on the first resist frames 6, is heated, and is developed, and then, water washing is carried out to form the second resist frames 9. The thickness $w2$ of a covering layer is about 0.1 $\mu$m, and by this, a trench narrowed to a width $w1=0.4$ $\mu$m can be obtained. As shown in the drawing, the side wall of the second resist frame 9 constituting the inner wall of the trench is uniformly covered. When Permalloy (NiFe) of a thickness $d2=4.5$ $\mu$m is formed by the frame plating method, a plating film 202 accurately controlled to a desired size can be obtained.

On the other hand, FIGS. 3B and 3C are views showing sections of patterns formed by using the conventional fine pattern forming method shown in FIGS. 10A to 10E and the frame plating method shown in FIGS. 9A to 9E. A film thickness, a width of a trench, and the like are the same as the embodiment.

First, after a first resist is coated on a substrate, exposure and development are carried out, and next, after washing is carried out, a washing solution is blown away by a spin drying method and the substrate is dried. Next, after a prewet treatment is carried out, a fine pattern forming material is coated on first resist frames 532, and after heating and development are carried out, washing is carried out to form second resist frames 536. In this case, since adhesion of the fine pattern forming material in the trench between the first resist frames 532 becomes irregular, a region is produced in which even if heating is carried out, a cross-linking reaction is not generated and narrowing does not occur.

When the side walls of the formed second resist frames 536 at the trench side are observed, in the case of FIG. 3B, a side wall α of the resist frame at the bottom of the trench is not covered, but is extended by a width w2. In the case of FIG. 3C, not only on the side wall α of the resist frame at the bottom of the trench, but also on a side wall portion β from the trench bottom to a predetermined height and a side wall portion γ of a trench upper portion, regions which are not covered are formed. Even if frame plating is carried out by the trench pattern like this, inaccurate plating films 514 are merely formed as shown in FIGS. 3B and 3C.

Further, since the cross-linked layer of the second resist layer is formed on the first resist frame, its adhesiveness to the substrate 1 is originally inferior. When the substrate is once dried after the first resist frame is formed, the cross-linked layer is contracted and the adhesiveness between the cross-linked layer and the substrate is further lowered. Accordingly, if the second resist frame is formed and the frame plating method is used after the substrate drying treatment is carried out, the plating solution intrudes into the interface between the second resist frame and the substrate, and a plating film is formed also in that place, so that the same state as FIG. 3B occurs after plating.

However, as in this embodiment, if the fine pattern forming material is coated in the state where the surface of the substrate has always moisture and the second resist frame is formed, since a gap is not formed between the resist frame and the substrate, an accurate plating film can be formed.

Like this, according to this embodiment, even if the film thickness of the resist frame is extremely larger than the width between the resist frames, the fine pattern forming material can be certainly formed on the surface of the resist frame. Accordingly, even if the resist pattern or trench pattern has a very high aspect ratio, a plating film of a fine pattern can be formed.

Incidentally, in the fine pattern forming method and the frame plating method according to the first embodiment, the washing solution 7 in the washing process carried out at the final stage of the photolithography process for forming the first resist frames 6 is not dried but is made to remain as it is. However, it is not desirable that the state where the washing solution 7 is adhered to the substrate 1 continues for a long time. First, there is a possibility that a foreign substance such as dust is adhered to the washing solution 7 on the substrate 1, and causes a defect in a subsequent process. Second, there is a possibility that the electrode film 2 for plating is rusted by water. Third, there is also a possibility that the first resist frame 6 absorbs moisture to swell, and adhesiveness is deteriorated to cause pattern peeling. Besides, in view of transportation of the substrate, there is also a possibility that a transporting device is wetted by the wet substrate 1 when the substrate 1 is transported to a coater for coating the second resist.

Figure 4:
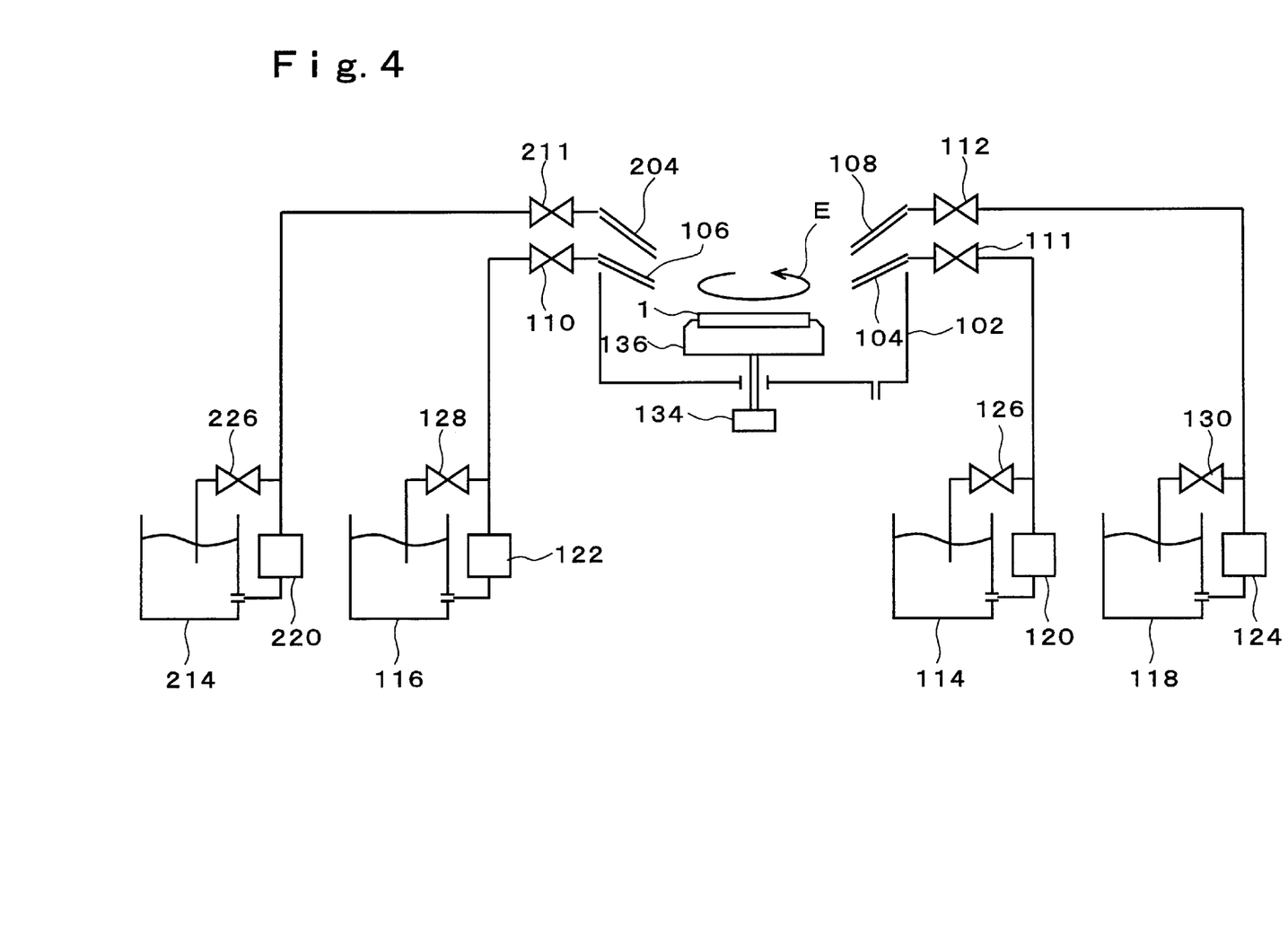
FIG. 4 is a schematic view showing an outline structure of a developing/washing device according to a second embodiment of the present invention.

Then, as a second embodiment of the present invention, a developing/washing device suitably used in the fine pattern forming method and the frame plating method according to the first embodiment will be described with reference to FIG. 4. FIG. 4 is a schematic view showing an outline structure of the developing/washing device according to this embodiment.

The developing/washing device includes a developing/washing bath 102. A substrate holder 136 on which a substrate 1 is mounted is contained in the developing/washing bath 102. The substrate holder 136 can rotate the substrate 1 in the direction of arrow E by rotating a motor 134.

A developing solution nozzle 104 for spraying a developing solution for development of a first resist onto the surface of the substrate 1 on the substrate holder 136 is provided in the developing/washing bath 102. The developing solution nozzle 104 sprays the developing solution in a developing solution tank 114 onto the substrate 1 by opening a valve 111 and closing a valve 126 while a pump 120 is operated.

Besides, a washing solution nozzle 106 for spraying a washing solution for washing of the developing solution of the first resist or for washing of a developing solution of a fine pattern forming material onto the surface of the substrate 1 on the substrate holder 136 is provided in the developing/washing bath 102. The washing solution nozzle 106 sprays the washing solution in a washing solution tank 116 onto the substrate 1 by opening a valve 110 and closing a valve 128 while a pump 122 is operated.

Further, a fine pattern forming material spray nozzle 108 for spraying the fine pattern forming material for formation of the second resist layer 8 onto the surface of the substrate 1 on the substrate holder 136 is provided in the developing/washing bath 102. The fine pattern forming material spray nozzle 108 sprays the fine pattern forming material in a fine pattern forming material tank 118 onto the substrate 1 by opening a valve 112 and closing a valve 130 while a pump 124 is operated.

Further, a fine pattern forming material developing solution nozzle 204 for spraying the developing solution for the fine pattern forming material onto the surface of the substrate 1 on the substrate holder 136 is provided in the developing/washing bath 102. The fine pattern forming material developing solution nozzle 204 sprays the developing solution for the fine pattern forming material in a fine pattern forming material developing solution tank 214 onto the substrate 1 by opening a valve 211 and closing a valve 226 while a pump 220 is operated.

Next, the operation of the developing/washing treatment in the developing/washing device of this embodiment will be described. When exposure of the first resist layer by a projection exposure device or the like is ended, the exposed substrate 1 mounted on an X-Y stage of the exposure device is transported by a substrate transporting device, and after a heat treatment by a heating device is performed as the need arises, it is mounted on the substrate holder 136 in the developing/washing bath 102 of this device.

When the substrate 1 is mounted on the substrate holder 136, the motor 134 is driven to rotate the substrate holder 136 at a low revolving speed. At the same time, the valve 111 is opened and the valve 126 is closed while the pump 120 is operated, so that the developing solution in the developing solution tank 114 is sprayed onto the whole surface of the substrate 1 from the developing solution nozzle 104.

When the predetermined developing treatment is ended, the valve 126 is opened and the valve 111 is closed so that supply of the developing solution from the developing solution nozzle 104 is stopped.

Next, the valve 110 is opened and the valve 128 is closed while the pump 122 is operated, so that the washing solution in the washing solution tank 116 is sprayed onto the substrate 1 from the washing solution nozzle 106. When the predetermined washing treatment is ended, the valve 128 is opened and the valve 110 is closed, so that supply of the washing solution from the washing solution nozzle 106 is stopped.

Subsequently, in the state where the washing solution is adhered to the substrate 1, the fine pattern forming material for formation of the second resist layer is sprayed from the nozzle 108.

When the above process is ended, the rotation of the substrate holder 136 is stopped, and the substrate 1 is transported to a heating device for heating the first and second resist layers in a next process by a not-shown substrate transporting system. After heating and cooling, the substrate 1 is mounted on the substrate holder 136 by a not-shown substrate transporting system. When the substrate 1 is mounted on the substrate holder 136, the motor 134 is driven to rotate the substrate holder 136 at a low revolving speed. At the same time, the valve 211 is opened and the valve 226 is closed while the pump 220 is operated, so that the developing solution for the fine pattern forming material in the fine pattern forming material developing solution tank 214 is sprayed onto the whole surface of the substrate from the fine pattern forming material developing solution nozzle 204. When the predetermined development process is ended, the valve 226 is opened and the valve 211 is closed, so that supply of the developing solution for the fine pattern forming material from the fine pattern forming material developing solution nozzle 204 is stopped.

Next, the valve 110 is opened and the valve 128 is closed while the pump 122 is operated, so that the washing solution in the washing solution tank 116 is sprayed onto the substrate 1 from the washing solution nozzle 106. When the predetermined washing treatment is ended, the valve 128 is opened and the valve 110 is closed, so that supply of the washing solution from the washing solution nozzle 106 is stopped. When the washing is ended, the substrate holder 136 is rotated at a high revolving speed to blow away the washing solution, and the substrate 1 is dried.

Like this, according to this embodiment, the state where the washing solution is adhered to the substrate does not continue for a long time, and it is possible to extremely lower the possibility that a foreign substance such as dust adheres to the washing solution on the substrate. Besides, since a time when moisture is in contact with the electrode film for plating can be suppressed to a very short time, it is possible to almost completely remove the possibility that rust is generated in the electrode film. Besides, it is also possible to avoid the possibility that the resist frame absorbs moisture to swell. Further, since substrate transportation by a conventional substrate transporting system is not carried out, there does not occur such a case that an existing transporting device is wetted by a wet substrate.

Next, as a third embodiment of the present invention, a manufacturing method of a thin film magnetic head using the fine pattern forming method and the frame plating method according to the first embodiment will be described with reference to FIGS. 5A to 5H and FIGS. 8A to 8C. FIGS. 5A to 5H are process sectional views showing the manufacturing method of the thin film magnetic head, FIGS. 5A to 5D are sectional views taken along a plane passing through the center of a track of the magnetic head, and FIGS. 5E to 5H are sectional views seen in the direction of an air bearing surface (ABS).

Incidentally, this embodiment shows a case of a composite type thin film magnetic head in which an inductive recording head portion and a magnetoresistive effect (MR) reproduction head portion are integrally laminated. However, it is needless to say that the frame plating method of the embodiment can also be applied to a thin film magnetic head in which only an inductive recording head portion is provided.

Figure 5A:
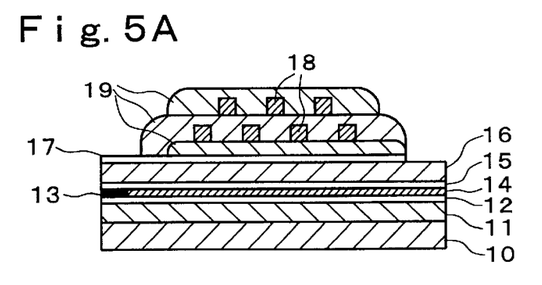
FIGS. 5A to 5H are process sectional views showing a manufacturing method of a thin film magnetic head using a fine pattern forming method and a frame plating method according to a third embodiment of the present invention.

First, an insulating layer 10 is laminated on a not-shown substrate made of a ceramic material such as $Al_2O_3TiC$. This insulating layer 10 is formed preferably to a thickness of about 1 to 2 μm by a sputtering method or the like from an insulating material such as $Al_2O_3$ or $SiO_2$.

Next, a layer for a lower shield 11 is laminated thereon, and further, an insulating layer 12 for a shield gap is laminated thereon. The layer for the lower shield 11 is formed preferably to a thickness of about 100 to 5000 nm by the sputtering method, plating method or the like from a material such as AlFeSi, NiFe, CoFe, CoFeNi, FeN, FeZrN, FeTaN, CoZrNb, or CoZrTa. The insulating layer 12 for the shield gap is formed preferably to a thickness of about 10 to 200 nm by the sputtering method or the like from an insulating material such as $Al_2O_3$ or $SiO_2$.

Next, an MR component 13 on the insulating layer 12 is formed, and a lead conductor 14 is formed to be electrically connected to both ends of the MR element 13. Although the MR element 13 may be made to have a single layer structure of a magnetic material, it is desirable to make a multi-layer structure in which a magnetic layer and a nonmagnetic layer are alternately laminated. As the material of the magnetic layer, NiFe, NiFeRh, FeMn, NiMn, Co, Fe, NiO, NiFeCr, or the like is preferable, and as the material of the nonmagnetic layer, Ta, Cu, Ag or the like is preferable. Besides, as the multi-layer structure, for example, a three layer structure of NiFeRh/Ta/NiFe, or a plural-layer structure of NiFe/Cu/NiFe/FeMn, NiFe/Cu/Co/FeMn, Cu/Co/Cu/NiFe, Fe/Cr, Co/Cu, Co/Ag, or the like is made one unit, and a plurality of such units may be laminated. In the case of the multi-layer structure, it is preferable that the thickness of the magnetic layer is made 0.5 to 50 nm, especially 1 to 25 nm, and the thickness of the nonmagnetic layer is also made 0.5 to 50 nm, especially 1 to 25 nm. It is preferable that the number of repeated laminate layers of the units is 1 to 30, especially 1 to 20. It is preferable that the thickness of the whole of the MR component 13 is 5 to 100 nm, especially 10 to 60 nm. In order to laminate the layers for the MR component, the sputtering method, plating method or the like is used. It is preferable that the lead conductor 14 is formed to a film thickness of 10 to 500 nm, especially about 50 to 300 nm by the sputtering method, plating method or the like from a conductive material such as W, Cu, Au, Ag, Ta, Mo, Co, or Pt.

Next, an insulating layer 15 for a shield gap is laminated on the MR component 13 and the lead conductor 14. This insulating layer 15 is formed to a thickness of 5 to 500 nm, preferably about 10 to 200 nm by the sputtering method or the like from an insulating material such as $Al_2O_3$ or $SiO_2$.

The respective layers of the MR reproduction head portion described above are patterned by a general liftoff method using a resist pattern, a milling method, or a method using both these methods.

Next, a magnetic layer for a lower magnetic pole 16 of a recording head portion also serving as an upper shield of the MR component 13 is laminated, and an insulating layer for a recording gap 17 is laminated thereon. The layer for the lower magnetic pole 16 is formed preferably to a thickness of about 500 to 4000 nm by the plating method, sputtering method or the like from a soft magnetic material such as NiFe, CoFe, CoFeNi, or FeN. The insulating layer for the recording gap 17 is formed to a thickness of about 10 to 500 nm by the sputtering method or the like from a material such as $Al_2O_3$ or $SiO_2$.

Thereafter, a coil 18 and an insulating layer 19 surrounding this coil 18 are formed on the recording gap 17. The coil 18 is formed to a thickness of about 2 to 5 μm by the frame plating method or the like from a conductive material such as Cu. The insulating layer 19 is formed to a thickness of about 3 to 20 μm by thermally hardening a photoresist material.

Figure 5B:
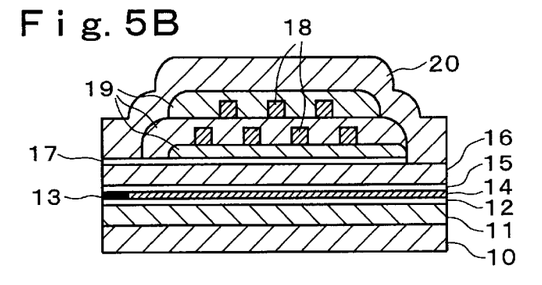
Figure 5C:
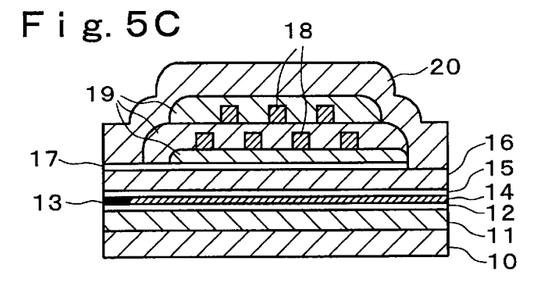
Figure 5D:
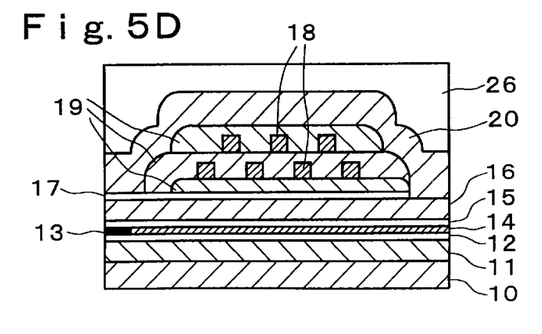
Figure 5E:
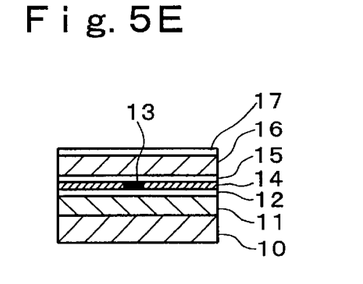

The layer structure as shown in FIGS. 5A and 5E is obtained through the above steps. Incidentally, the coil 18 may have two layers as shown in the drawing, or three layers or more, or may have a single layer.

Figure 5F:
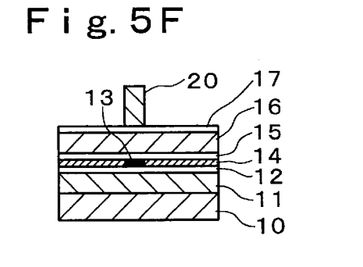
Figure 5G:
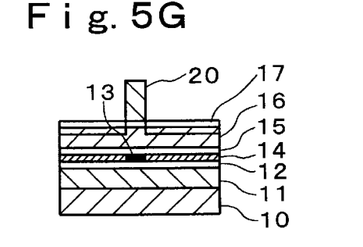

Next, as shown in FIGS. 5B and 5F, an upper magnetic pole 20 including a magnetic pole portion at an ABS side and a yoke portion at a rear side is formed on the thus formed insulating layer 19 by the frame plating method. The upper magnetic pole 20 is formed preferably to a thickness of about 3 to 5 μM from a soft magnetic material such as NiFe, CoFe, CoFeNi, or FeN. At this time, the shape of the magnetic pole portion of the upper magnetic pole 20 seen from the ABS side is formed to be as shown in the drawing.

Hereinafter, the frame plating method for forming the upper magnetic pole 20 having the shape like this will be described. FIGS. 6A to 8C are process sectional views showing a forming process of the upper magnetic pole by the frame plating method according to this embodiment.

Figure 6A:
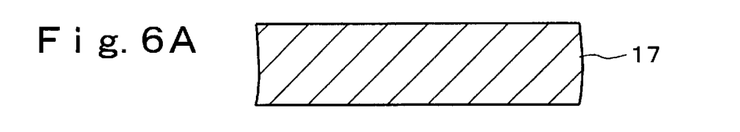
FIGS. 6A to 6E are process sectional views showing the frame plating method in the manufacturing method of the thin film magnetic head according to the third embodiment of the present invention.
Figure 6B:
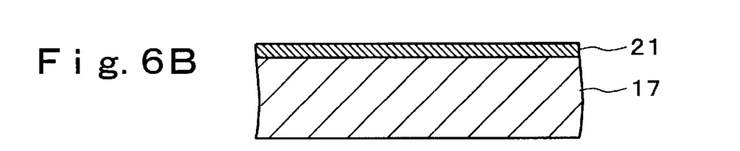

As shown in FIG. 6B, a metal under film 21 preferably made of the same component as the layer to be plated, such as Cu, NiFe, or Au, is formed to a thickness of about 10 to 500 nm on the recording gap 17 shown in FIG. 6A.

Figure 6C:
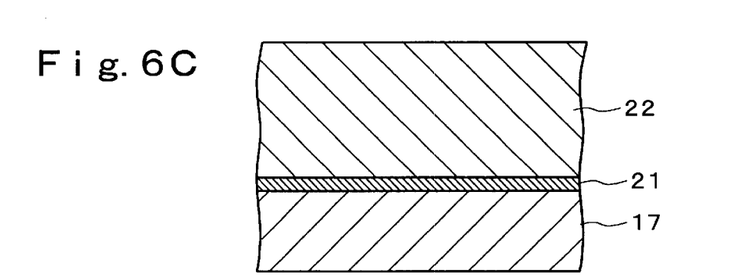
Figure 6D:
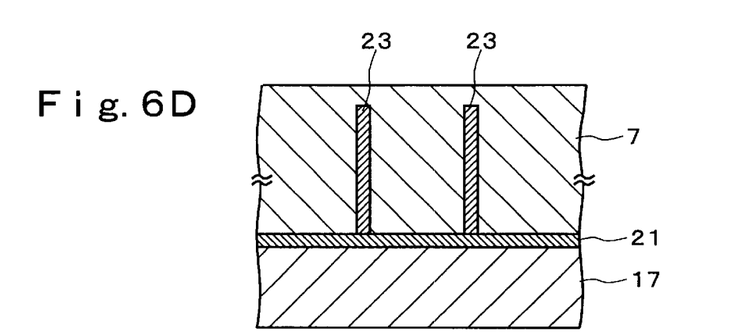
Figure 6E:
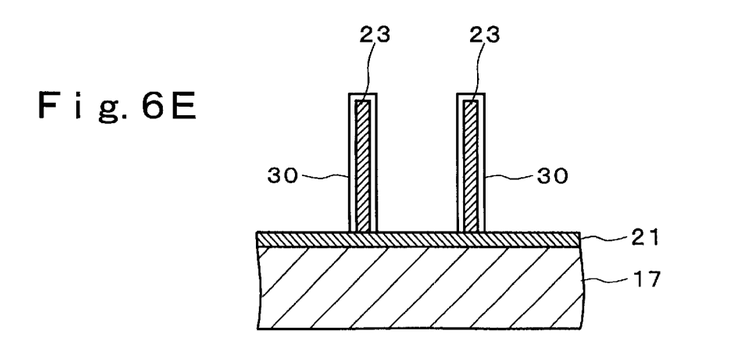

Next, as shown in FIG. 6C, a resist material 22 is coated on the metal under film 21 and is patterned to form first resist frames 23 as shown in FIG. 6D. In the formation of the first resist frames 23, a developing solution on the surface of the first resist frames 23 is washed by a washing solution 7 in a washing process subsequent to a developing process, and a development dissolving reaction of the surfaces of the first resist frames 23 is stopped. When the washing is ended, as described in the first embodiment, in the state where the washing solution 7 is not blown away but the layer of the washing solution 7 is held on the surface of the substrate, a soluble fine pattern forming material (second resist layer) is coated on the whole surface.

Next, the first resist frames 23 and the second resist layer formed thereon are subjected to mixing bake, and developing and washing are carried out as described in the first embodiment, so that second resist frames 30 covering the first resist frames 23 are formed. The formed second resist frames 30 become resist patterns in which the separation width in the patterns is narrower than that in the first resist frames 23 (see FIG. 6E).

Figure 7A:
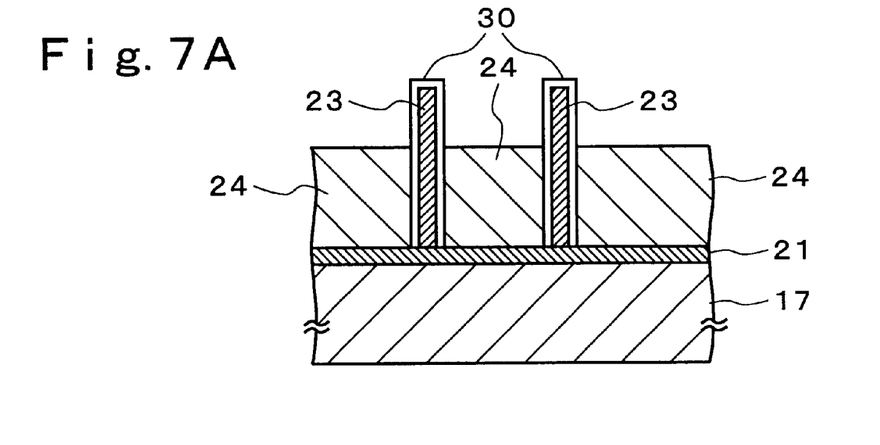
FIGS. 7A to 7C are process sectional views showing the frame plating method in the manufacturing method of the thin film magnetic head according to the third embodiment of the present invention.

As shown in FIG. 7A, the second resist frames 30 are used as a mold, and plating layers 24 are obtained by plating of a soft magnetic material such as NiFe, CoFe, CoFeNi, or FeN.

Figure 7B:
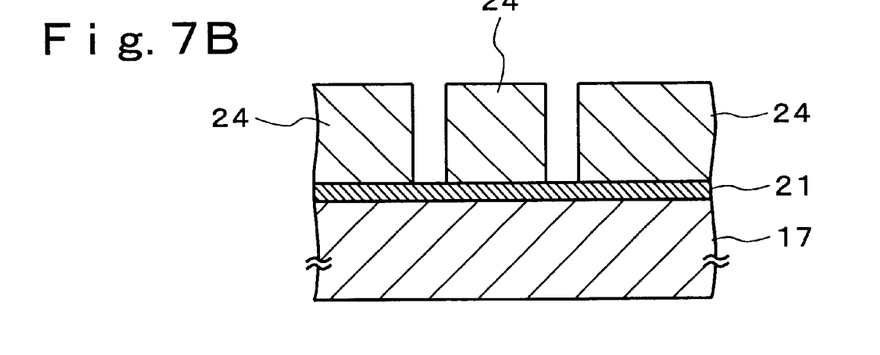
Figure 7C:
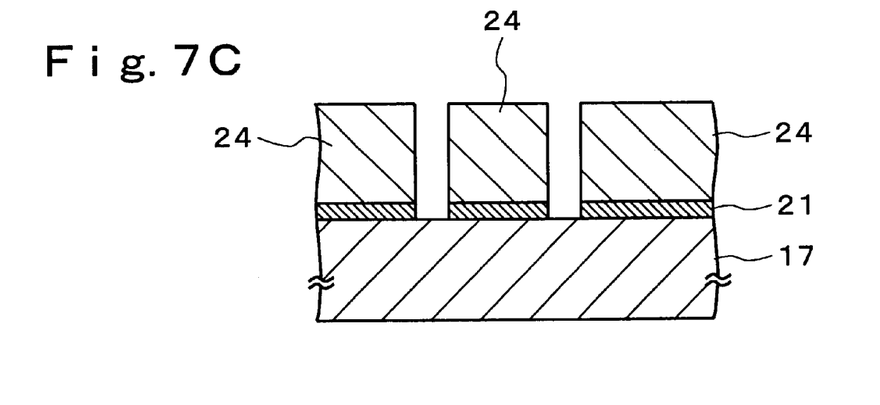

Next, as shown in FIG. 7B, the first and second resist frames 23 and 30 are peeled off by using an organic resin or the like. Next, as shown in FIG. 7C, while the plating layers 24 are used as a mask, the metal under film 21 after the removal of the resist patterns is removed by means such as ion milling.

Figure 8A:
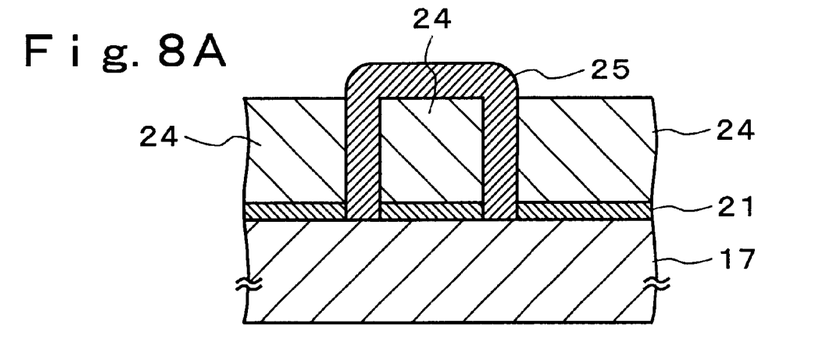
FIGS. 8A to 8C are process sectional views showing the frame plating method in the manufacturing method of the thin film magnetic head according to the third embodiment of the present invention.
Figure 8B:
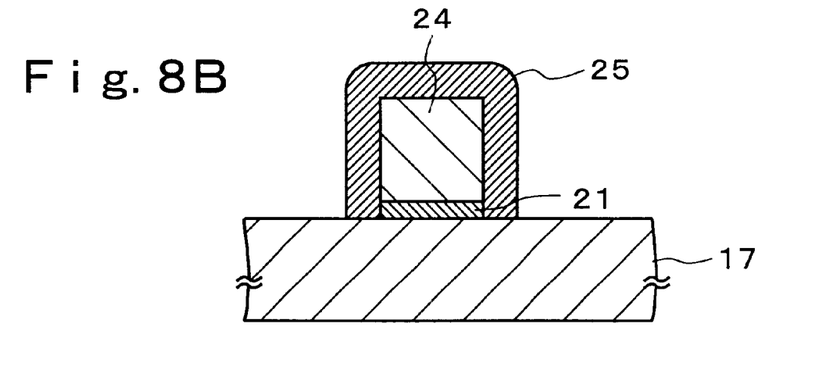
Figure 8C:
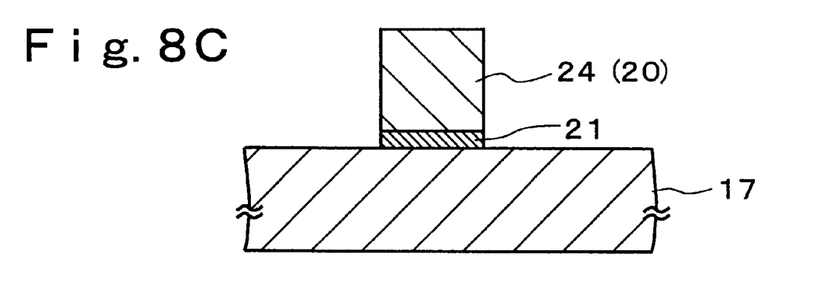

Next, as shown in FIG. 8A, an upper part and a periphery of a portion to be left in the plating layers 24 are covered with a resist layer 25. Next, as shown in FIG. 8B, the plating layers 24 and the metal under film 21 at unnecessary portions are removed by wet etching or the like, and further, the resist layer 25 is peeled off by using an organic solvent or the like, so that the upper magnetic pole 20 as shown in FIG. 8C is formed.

With respect to FIGS. 5A to 5H again, as shown in FIGS. 5C and 5G, while the thus formed upper magnetic pole 20 is used as a mask, dry etching such as ion milling or RIE (reactive ion etching) is carried out, so that a portion of the insulating layer for the recording gap 17 not covered with the mask is removed, and further, a portion not covered with the mask is removed to the middle of the magnetic layer for the lower magnetic pole 16.

Figure 5H:
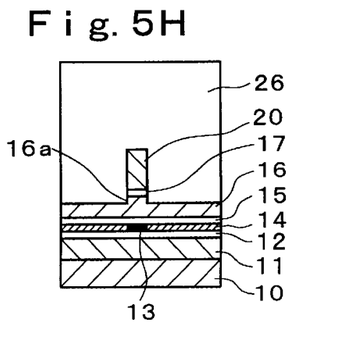

By this, as shown in FIGS. 5D and 5H, a protrusion 16a opposite to the lower end of the upper magnetic pole 20 through the recording gap 17 and having the same width is formed at the lower magnetic pole 16. Next, after a pad bump or the like is formed, a protective layer 26 is laminated. This protective layer 26 is formed to a film thickness of about 5 to 50 μm by the sputtering method or the like from an insulating material such as $Al_2O_3$ or $SiO_2$.

As described above, in this embodiment, since the fine pattern forming method and the frame plating method according to the first embodiment is used, the treatment of blowing away the washing solution is not carried out in the washing process when the first resist frames 23 are formed. Accordingly, since the fine pattern forming material can be certainly formed on the surface of the resist pattern, it becomes possible to manufacture a thin film magnetic head with high accuracy.

The present invention is not limited to the above embodiments, but various modifications can be made.

For example, although the description has been given of the thin film magnetic head as an example, the present invention is not limited to this, but can be widely applied to manufacture of a device (micro device) having a fine structure, including a semiconductor device.

As described above, according to the present invention, even if the film thickness of the resist pattern is extremely large as compared with the width between the resist patterns, it becomes possible to certainly form the fine pattern forming material on the surface of the resist pattern.

What is claimed is:

1. A fine pattern forming method, comprising the steps of:

coating a resist, which contains a material generating acid by heating or light irradiation, on a substrate;

forming a resist pattern by exposing the resist through a pattern, developing the resist, and washing a developing solution out with a washing solution;

coating a fine pattern forming material containing a material, which is cross-linked by existence of acid, on the substrate in a state where the washing solution is adhered to the substrate;

generating acid in the resist pattern by heating or light irradiation;

covering the resist pattern with a cross-linked layer generated on an interface between the resist pattern and the fine pattern forming material;

developing a not-cross-linked layer of the fine pattern forming material by a developing solution for the fine pattern forming material; and washing the developing solution out with a washing solution.

2. A fine pattern forming method according to claim 1, wherein the substrate is not dried in a period from development of the resist pattern to coating of the fine pattern forming material.

3. A plating method comprising the steps of:

forming an electrode film on a substrate;

coating a resist, which contains a material generating acid by heating or light irradiation, on a substrate;

forming resist pattern by exposing the resist through a pattern, developing the resist, and washing a developing solution out with a washing solution;

coating a fine pattern forming material containing a material, which is cross-linked by existence of acid, on the substrate in a state where the washing solution is adhered to the substrate;

generating acid in the resist pattern by heating or light irradiation;

covering the resist pattern with cross-linked layer generated on interface between the fine pattern forming material and the resist pattern;

developing a not-cross-linked layer of the fine pattern forming material by a developing solution for the fine pattern forming material;

washing the developing solution out with a washing solution;

immersing a surface of the substrate in a plating solution; and forming a plating film between the covered resist pattern.

4. A manufacturing method of a thin film magnetic head, comprising a plating process for forming a plating film by using a mold formed by patterning a resist, wherein the plating process includes the plating method according to claim 3.

* * * * *